(12) United States Patent
Kaiser et al.

(10) Patent No.: US 7,181,643 B2
(45) Date of Patent: Feb. 20, 2007

(54) METHOD FOR COMPARING THE ADDRESS OF A MEMORY ACCESS WITH AN ALREADY KNOWN ADDRESS OF A FAULTY MEMORY CELL

(75) Inventors: Robert Kaiser, Kaufering (DE); Florian Schamberger, München (DE)

(73) Assignee: Infineon Technologies AG, Munich (DE)

( * ) Notice: Subject to any disclaimer, the term of this patent is extended or adjusted under 35 U.S.C. 154(b) by 479 days.

(21) Appl. No.: 10/689,422

(22) Filed: Oct. 20, 2003

(65) Prior Publication Data

US 2004/0153843 A1 Aug. 5, 2004

Related U.S. Application Data

(63) Continuation of application No. PCT/EP02/03913, filed on Apr. 9, 2002.

(30) Foreign Application Priority Data

Apr. 19, 2001 (DE) ................................ 101 19 125

(51) Int. Cl.
*G06F 11/00* (2006.01)
(52) U.S. Cl. .......................................................... 714/6
(58) Field of Classification Search .................... 714/6, 714/7, 8
See application file for complete search history.

(56) References Cited

U.S. PATENT DOCUMENTS

| | | | | |
|---|---|---|---|---|
| 4,389,715 A * | 6/1983 | Eaton et al. ................. | 714/711 |
| 5,938,774 A * | 8/1999 | Hsu ............................... | 714/6 |
| 6,041,422 A * | 3/2000 | Deas .............................. | 714/8 |
| 6,115,828 A * | 9/2000 | Tsutsumi et al. .............. | 714/7 |
| 6,199,177 B1 * | 3/2001 | Blodgett ......................... | 714/7 |
| 6,397,349 B2 * | 5/2002 | Higgins et al. ................ | 714/7 |
| 6,408,401 B1 * | 6/2002 | Bhavsar et al. ................ | 714/7 |
| 6,505,305 B1 * | 1/2003 | Olarig ............................ | 714/5 |
| 6,571,353 B1 * | 5/2003 | Sato ............................... | 714/7 |
| 6,785,837 B1 * | 8/2004 | Kilmer et al. ................. | 714/7 |
| 2004/0153843 A1 * | 8/2004 | Kaiser et al. ................. | 714/42 |
| 2005/0160310 A1 * | 7/2005 | Ellis et al. ..................... | 714/7 |

OTHER PUBLICATIONS

Lucente, M. A. et al.: "Memory System Reliability Improvement Through Associative Cache Redundancy", IEEE Journal of Solid State Circuits, vol. 26, No. 3, Mar. 1991, pp. 404-409.

* cited by examiner

*Primary Examiner*—Scott Baderman
*Assistant Examiner*—Brian Assessor
(74) *Attorney, Agent, or Firm*—Laurence A. Greenberg; Werner H. Stemer; Ralph E. Locher

(57) ABSTRACT

A comparison method compares the address of a memory cell with a known address of a faulty memory cell in a semiconductor memory module. The module is subdivided into banks and has an address structure in which each address is associated with a bank that is organized in rows and columns and is defined by a row address, a column address and a bank address. Not only the row address is determined, but also the column address and the bank address when a memory access occurs. A bank is activated with a bank selection signal, and the access to a valid address of a faulty memory cell is indicated by an enable register.

2 Claims, 1 Drawing Sheet

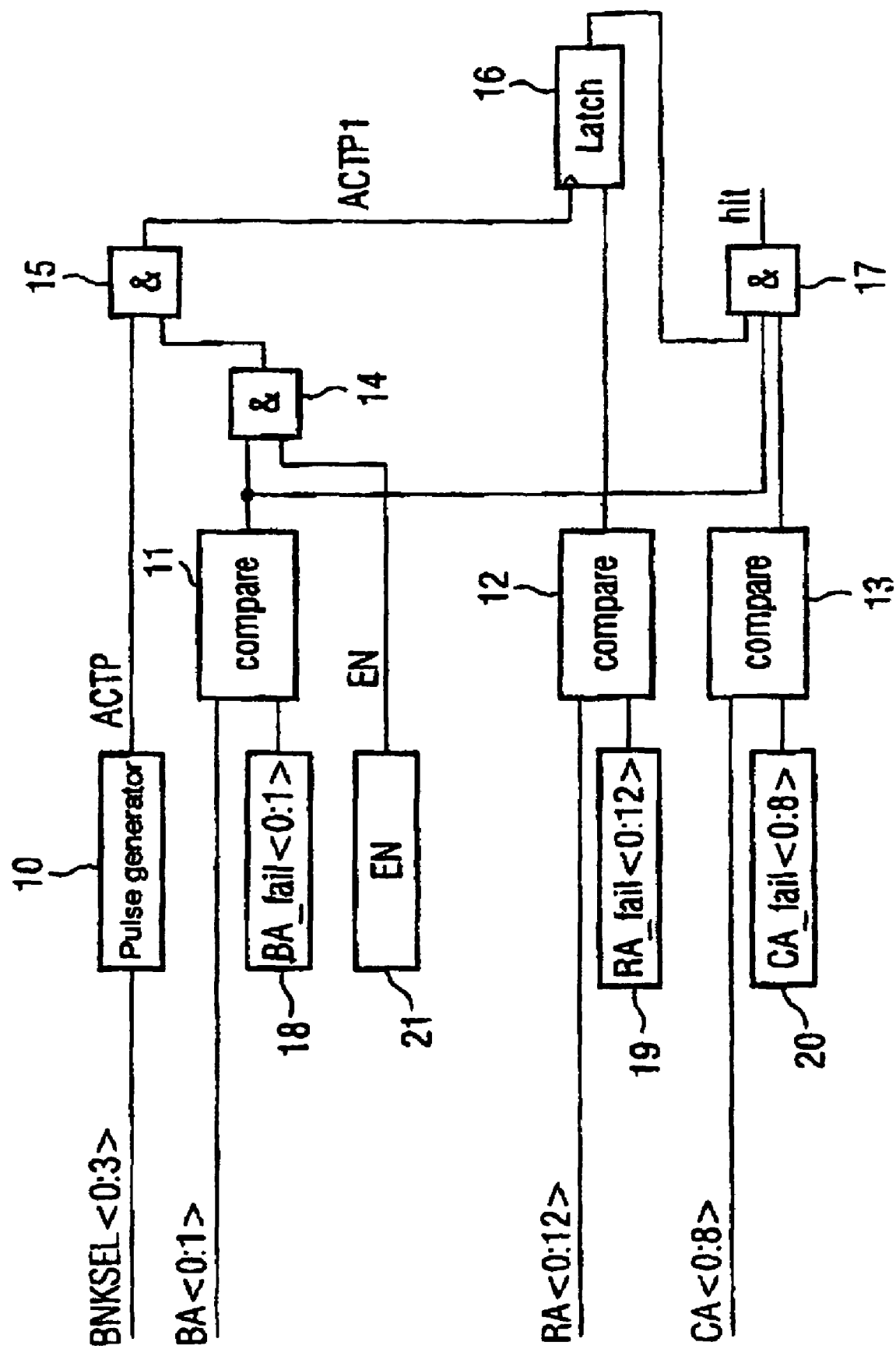

METHOD FOR COMPARING THE ADDRESS OF A MEMORY ACCESS WITH AN ALREADY KNOWN ADDRESS OF A FAULTY MEMORY CELL

CROSS-REFERENCE TO RELATED APPLICATION

This application is a continuation of copending International Application No. PCT/EP02/03913, filed Apr. 9, 2002, which designated the United States and which was not published in English.

BACKGROUND OF THE INVENTION

Field of the Invention

The invention lies in the memory technology field. More specifically, the invention relates to a method for comparing the address of a memory cell with an already known address of a faulty memory cell in a semiconductor memory module which is subdivided into banks and has an address structure in which each address is associated with a bank which is organized in rows and columns and is defined by way of a row address, a column address, and a bank address.

Until now, essentially only the rows—or alternatively the column address—have been compared with the faulty address in the method under discussion. As soon as an address hit is achieved, the method provides for the entire row or the entire column to be replaced by a replacement row or replacement column. The primary problem with the previous method is that the comparison between the addresses does not take place sufficiently quickly, so that, in particular, real-time comparison is impossible. The conventional method wastes redundant memory space by globally replacing entire rows or entire columns when an address hit is found.

A method for comparing the entire address of an access and of an already-known address of an individual faulty memory cell is known from an article by Lucente, Harris, and Muir: *Memory system reliability improvement through associative cache redundancy*, in: IEEE J. of Solid-State Circuits, Vol. 26, No. 3, March 1991, pages 404–09.

SUMMARY OF THE INVENTION

It is accordingly an object of the invention to provide a method for comparing a memory access address with a known address of a faulty memory cell which overcomes the above-mentioned disadvantages of the heretofore-known devices and methods of this general type and which method can be carried out sufficiently quickly so that real-time determination is possible, and which does not lead to memory space being wasted.

Since, in the case of the method according to the invention, not only the row addresses but also the column addresses and bank addresses are always determined when a memory access takes place, this avoids redundant memory space being wasted since this specific determination of fault locations in the memory also means that replacements are required only for these specific addresses in the address structure.

One particularly advantageous embodiment of the method according to the invention, which guarantees real-time processing owing to the use of a process whose timing has been tightened up for address determination, provides for the row address as well as the column address and the bank address to be determined as follows:

in a first cycle, one row is activated using a row address and the associated bank address, in a second cycle, the activated row is accessed using a column address and a bank address, during the activation of the row:

a) the row address of the activated row is compared with the row address of the faulty memory cell, and the comparison result is passed to a latching circuit whose output signal is passed to a logic stage, b) the column address is compared with the column address of the faulty memory cell and the comparison result is passed to the logic stage, c) the bank address is compared with the bank address of the faulty memory cell and the comparison result is passed to the logic stage, d) an activation pulse is obtained from the rising flank of the bank selection signal in a pulse generator and is passed to the latching circuit if the comparison of the bank address with the bank address of the faulty memory cell produces a match and an enable register (EN) is set, e) the latching circuit outputs a latching signal if the comparison result in step a) is positive and an activation pulse (ACTP1) has arrived from step d), and the logic stage outputs a hit signal, which indicates access to a faulty memory cell, if the comparison results in steps b) and c) are positive and the latching circuit is outputting the latching signal.

The invention also achieves the following advantages: some of the comparison steps are actually carried out in an early comparison stage while some of the other comparison processes, those which take place in the second time-critical cycle, are reduced in number due to the use of a latching circuit. Furthermore, determination reliability is provided in that the latching circuit always automatically contains the correct value whenever a determination process is activated.

Other features which are considered as characteristic for the invention are set forth in the appended claims.

Although the invention is illustrated and described herein as embodied in a method for comparing the address of a memory access with an already known address of a faulty memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE of the drawing is a schematic of a part of a semiconductor module that is configured according to the invention.

DESCRIPTION OF THE PREFERRED EMBODIMENTS

Referring now to the FIGURE of the drawing in detail, there is shown a pulse generator 10. Three comparison stages 11, 12, and 13 provided. Two logic stages 14 and 15 are suitable connected to the comparison stages. A latching circuit or a latch is annotated by the reference number 16, and a logic stage is shown at 17. A reference number 18 refers to a faulty bank address (BA_fail). A faulty row address is annotated by the reference number 19 (RA-fail). A faulty column address is annotated by the reference number 20 (CA_fail), and a register set (EN) is annotated by the reference number 21.

The elements mentioned above are connected or linked to one another as follows: the faulty bank address 18 is passed to one input of the comparison stage 11. A bank address is applied to the other input of this comparison stage 11. The faulty row address 19 is applied to one input of the comparison stage 12. A row address RA is applied to the other input of the comparison stage 12. The faulty column address 20 is applied to one input of the comparison stage 13. The column address CA is applied to the other input of the comparison stage 13.

The output of the logic stage 11 is applied to one input of the logic stage 14. The register set 21 is applied to the other input of the logic stage 14. The output of the comparison stage 14 is applied to one input of the logic stage 15. The output signal from the pulse generator 10 is applied to the other input of the logic stage 15. One or more bank selection signals (BNKSEL) is or are applied to the input of the pulse generator 10.

The output signal from the logic stage 15 is applied to one input of the latching circuit 16. The output of the comparison stage 12 is applied to the other input of the latching circuit 16. The logic stage 17 has three inputs, to one of which the output signal of the latching circuit 16 is applied, while the output signal from the comparison stage 11 is applied to a second input. The output from the comparison stage 13 is applied to the third input of the logic stage 17. The circuit explained above operates as follows:

When a memory access occurs, one row is activated in a first cycle, using a row address RA and the associated bank address BA. In the next, second cycle, the activated row is accessed using a bank address BA and a column address CA. By way of example, four independent banks may be provided. A maximum of one row may be activated in each bank. The number of banks depends on the architecture and may differ from the stated number 4. However, this changes nothing relating to the basic principle of the operation of the banks.

A pulse ACTP (Activation Pulse) is derived in the pulse generator from the rising flank of the bank selection signal (BNKSEL) during the row activation in the first cycle mentioned above. At the same time, the bank address BA which is being used at that time is compared with the known faulty bank address 18 (BA_fail). If these two addresses match and if the entire register set 21 (EN) is active (EN=1), the ACTP pulse is passed to the latching circuit 16 in the form of a pulse ACTP1. Using the pulse ACTP1 which has been passed to it, the result of the comparison of the current row address RA with the known faulty row address 19 (RA_fail) is locked or latched in the latching circuit 16. If the row addresses match, the output from the latching circuit 16 produces a logic 1. All this takes place during a single clock cycle which, in the end, ensures real-time address comparison. A relatively long time is available for this comparison since the actual access to data cannot take place, at the earliest, until the next cycle.

During the column access, the current column address CA must now also be compared with the known faulty column address 20 (CA_fail). Furthermore, the current bank address BA must be compared with the already known faulty bank address 18 (BA_fail). If the result of the two comparisons is positive and/or they produce a match, and if the latching circuit 16 is set from the comparison previously referred to, the output of the logic stage 17 changes to hit or logic 1, thus signaling access to a defective memory cell.

The method mentioned above has the advantage that an entire sequence of the necessary comparison accesses actually takes place at an early stage in the method, during which sufficient time is available for this purpose. Furthermore, the number of comparisons in the previously mentioned second, time-critical cycle is greatly reduced. Finally, the latching circuit automatically always contains the correct value whenever it is activated.

We claim:

1. In a semiconductor memory module divided into banks and having an address structure in which each address is associated with a bank organized in rows and columns and defined with a row address, a column address, and a bank address, a method for comparing a memory access address with a known address of a faulty memory cell, the method which comprises the following steps, to be carried in parallel with a memory cell access in a two cycle access:
    in a first cycle, activating a row by using a row address and a bank address, and during the activation of the row in the first cycle:
        comparing the row address with a row address of a faulty memory cell and passing a signal to a latch if an row address match is determined;
        comparing the bank address with a bank address of the faulty memory cell; and
        obtaining an activation pulse from a rising flank of a bank selection signal by a pulse generator, and passing the activation pulse to the latch if an address match of the bank address with the bank address of the faulty memory cell is determined and an enable register is set; and
    in a second cycle, accessing the activated row by using a column address and the bank address, and during the column access in the second cycle:
        comparing the column address with the address of the faulty memory cell and passing a signal to a logic stage if a column address is determined; and
        outputting a hit signal Indicating access to the faulty memory cell by the logic stage, if the bank address match signal, a latch output signal, and the column address match signal are applied to the logic stage, wherein the latch output signal is output to the logic stage by the latch if the activation pulse and the row address match signal are applied to the latch.

2. In a semiconductor memory module divided into banks and having an address structure in which each address is associated with a bank organized in rows and columns and is defined with a row address, a column address, and a bank address, a part of the semiconductor memory module comprising:
    a pulse generator;
    a first comparison stage, a second comparison stage, and a third comparison stage;
    a latch; and
    a first logic stage, a second logic stage, and a third logic stage;
    said first comparison stage having a first input receiving a faulty bank address and a second input receiving a bank address;
    said second comparison stage having a first input receiving a faulty row address and a second input receiving a row address;

said third comparison stage having a first input receiving a faulty column address and a second input receiving a column address;
said first logic having a first input receiving an output of said first comparison stage and a second input having applied thereto a register set;
said pulse generator having an input receiving a bank selection signal;
said second logic stage having a first input receiving an output of said first logic stage and a second input receiving an output of said pulse generator;

said latching circuit having a first input receiving an output of said second logic stage and a second input receiving an output of said second comparison stage;
said third logic stage having a first input receiving an output of said latching circuit, a second input receiving an output of said first comparison stage, and a third input receiving an output of said third comparison stage.

* * * * *